US009111964B2

(12) United States Patent
Sato et al.

(10) Patent No.: US 9,111,964 B2
(45) Date of Patent: Aug. 18, 2015

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Mitsuru Sato, Mie-ken (JP); Soichiro Kitazaki, Mie-ken (JP); Ryu Kato, Mie-ken (JP); Masaru Kito, Mie-ken (JP); Ryota Katsumata, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/019,798

(22) Filed: Sep. 6, 2013

(65) Prior Publication Data
US 2014/0284693 A1 Sep. 25, 2014

Related U.S. Application Data

(60) Provisional application No. 61/803,126, filed on Mar. 19, 2013.

(51) Int. Cl.
*H01L 29/792* (2006.01)
*H01L 29/66* (2006.01)
*H01L 27/115* (2006.01)

(52) U.S. Cl.
CPC .... *H01L 29/66833* (2013.01); *H01L 27/11582* (2013.01); *H01L 29/7926* (2013.01)

(58) Field of Classification Search
CPC ............. H01L 27/11551; H01L 27/11578; H01L 21/8221; H01L 29/792; H01L 29/66833

USPC ................................ 257/324, 326; 438/287
See application file for complete search history.

(56) References Cited

U.S. PATENT DOCUMENTS

| 8,203,884 | B2 | 6/2012 | Kito et al. |
| 8,218,358 | B2 | 7/2012 | Katsumata et al. |
| 8,372,720 | B2 | 2/2013 | Fukuzumi |
| 8,476,766 | B2 | 7/2013 | Tanaka et al. |
| 2010/0207195 | A1 | 8/2010 | Fukuzumi |
| 2010/0237402 | A1 | 9/2010 | Sekine et al. |

(Continued)

FOREIGN PATENT DOCUMENTS

| JP | 2009-146954 | 7/2009 |
| JP | 2010-225684 | 10/2010 |

(Continued)

*Primary Examiner* — Tu-Tu Ho
(74) *Attorney, Agent, or Firm* — Oblon, McClelland, Maier & Neustadt, L.L.P.

(57) ABSTRACT

According one embodiment, a nonvolatile semiconductor memory device, includes: a stacked body, and each of a plurality of electrode layers and each of a plurality of insulating layers being stacked alternately in the a stacked body; a first interlayer insulating film on the stacked body; a gate electrode on the first interlayer insulating film; a second interlayer insulating film on the gate electrode; a semiconductor layer extended from an upper end of the second interlayer insulating film to a lower end of the stacked body; a first insulating film between the semiconductor layer and each of the plurality of electrode layers; and a second insulating film between the semiconductor layer and the gate electrode, a thickness of the semiconductor layer provided above an upper end of the gate electrode being thicker than a thickness of the semiconductor layer provided below the upper end of the gate electrode.

14 Claims, 9 Drawing Sheets

(56) References Cited

U.S. PATENT DOCUMENTS

| | | |
|---|---|---|
| 2011/0018052 A1 | 1/2011 | Fujiwara et al. |
| 2011/0019480 A1 | 1/2011 | Kito et al. |
| 2011/0103153 A1 | 5/2011 | Katsumata et al. |
| 2012/0068354 A1 | 3/2012 | Tanaka et al. |
| 2013/0056814 A1* | 3/2013 | Higuchi ..................... 257/314 |
| 2013/0075805 A1 | 3/2013 | Sato et al. |
| 2013/0126961 A1 | 5/2013 | Fukuzumi |

FOREIGN PATENT DOCUMENTS

| | | |
|---|---|---|
| JP | 2011-23687 | 2/2011 |
| JP | 2011-29234 | 2/2011 |
| JP | 2011-96340 | 5/2011 |
| JP | 2012-69697 | 4/2012 |
| JP | 2013-69831 | 4/2013 |
| WO | WO 2009/075370 A1 | 6/2009 |

* cited by examiner

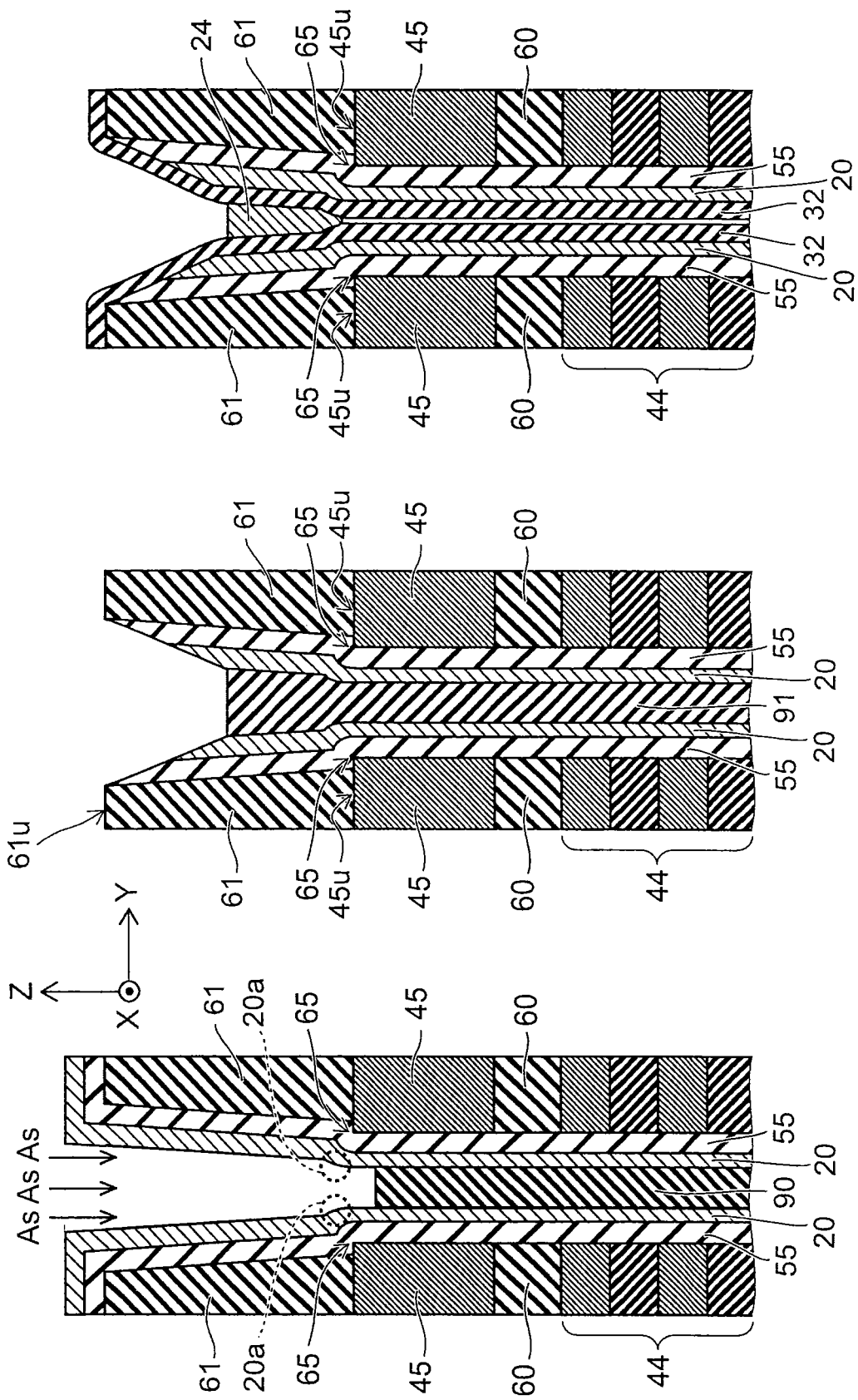

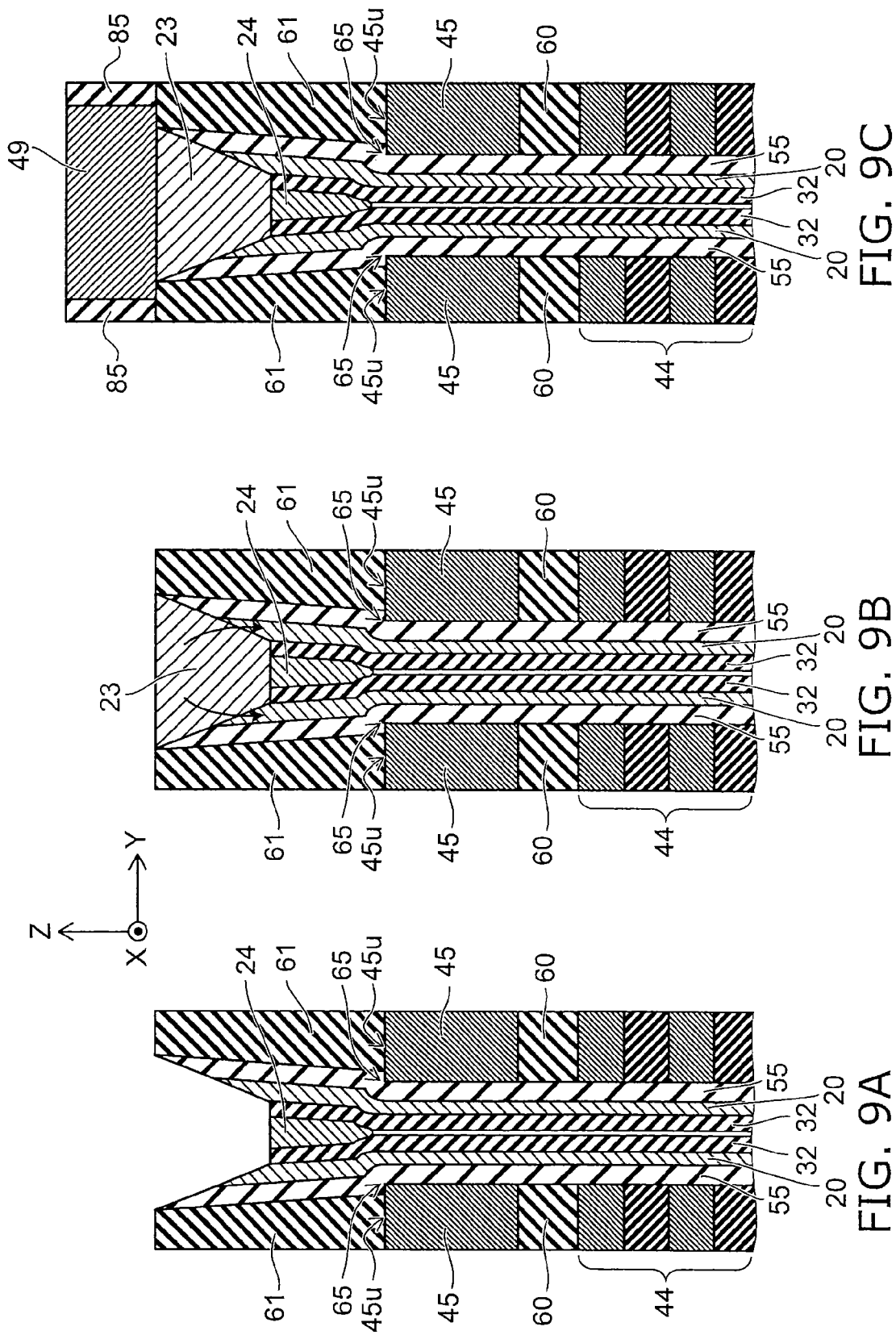

ved (not shown in FIG. 1, see FIG. 2) between these

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/803,126, filed on Mar. 19, 2013; the entire contents of which are incorporated herein by reference.

FIELD

Embodiments described herein relate generally to a nonvolatile semiconductor memory device and a method for manufacturing same.

BACKGROUND

There is a three-dimensional memory cell structure in which a memory hole is formed in a stacked body having a plurality of stacked electrode layers each functioning as a control gate, a memory film is formed on the side wall of the memory hole, and further a channel body layer is formed on the inside of the memory film. This type of three-dimensional memory cell structure has a memory string structure containing a channel body layer extending in the stacking direction of the stacked body.

In the formation process of the memory string structure, the channel body layer is formed on the side wall of a selection gate electrode via a gate insulating film, in addition to being formed on the side wall of the electrode layer via the memory film. Furthermore, the channel body layer is also formed above the selection gate electrode as a conductive path with a bit line or a source line.

BRIEF DESCRIPTION OF THE DRAWINGS

FIGS. 4A to 9C are schematic cross-sectional views showing a manufacturing process of the nonvolatile semiconductor memory device according to the embodiment.

DETAILED DESCRIPTION

In general, according one embodiment, a nonvolatile semiconductor memory device, includes: a foundation layer; a stacked body provided on the foundation layer, and each of a plurality of electrode layers and each of a plurality of insulating layers being stacked alternately in the a stacked body; a first interlayer insulating film provided on the stacked body; a gate electrode provided on the first interlayer insulating film; a second interlayer insulating film provided on the gate electrode; a semiconductor layer extended from an upper end of the second interlayer insulating film to a lower end of the stacked body; a first insulating film provided between the semiconductor layer and each of the plurality of electrode layers; and a second insulating film provided between the semiconductor layer and the gate electrode, a thickness of the semiconductor layer provided above an upper end of the gate electrode being thicker than a thickness of the semiconductor layer provided below the upper end of the gate electrode.

Embodiments of the invention will now be described below with reference to the drawings. In the description below, like members are identified with like numerals, and the description of members described once will be omitted as appropriate.

First, the outline of structure of a nonvolatile semiconductor memory device 1 according to the embodiment will be described.

Figure 1:
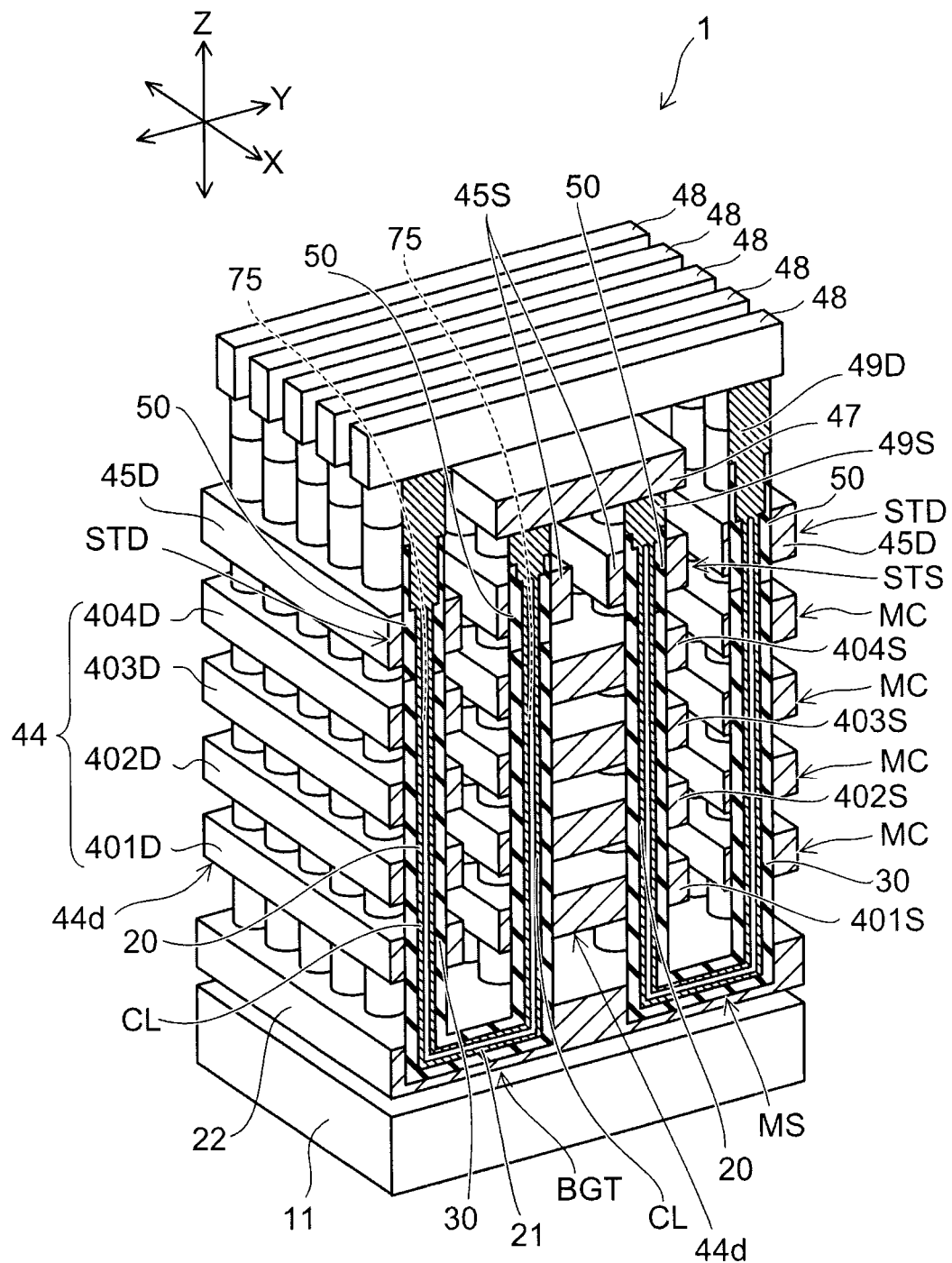
FIG. 1 is a schematic perspective view showing a memory cell array of a nonvolatile semiconductor memory device according to an embodiment.

FIG. 1 is a schematic perspective view showing a memory cell array of the nonvolatile semiconductor memory device according to the embodiment.

In FIG. 1, representation of insulating parts other than the insulating film formed on the inner wall of a memory hole 75 is omitted. The nonvolatile semiconductor memory device 1 is a nonvolatile semiconductor memory device of a three-dimensionally stacked type.

In FIG. 1, for convenience of description, the XYZ Cartesian coordinate system is introduced. In the coordinate system, two directions that are parallel to the major surface of a foundation layer 11 and are perpendicular to each other shall be the X direction and the Y direction, and the direction perpendicular to both the X direction and the Y direction shall be the Z direction.

The nonvolatile semiconductor memory device 1 according to the embodiment is a nonvolatile semiconductor memory device that can perform freely and electrically erasure/write-in of data and can hold stored contents even when the power is turned off.

In the nonvolatile semiconductor memory device 1, on the foundation layer 11, a semiconductor layer 22 (a back gate layer) is provided via an insulating layer not shown. The foundation layer 11 includes a semiconductor substrate (for example, a silicon substrate), an insulating layer (for example, an SiO$_2$ layer), a circuit etc. In the foundation layer 11, for example, active elements such as a transistor and passive elements such as resistance and capacitance are provided. The semiconductor layer 22 is, for example, a silicon (Si) layer to which an impurity element such as boron (B) is added.

Electrode layers 401D, 402D, 403D and 404D on the drain side and electrode layers 401S, 402S, 403S and 404S on the source side are stacked on the semiconductor layer 22. In the Z direction, an insulating layer 42 (a first insulating layer) is provided (not shown in FIG. 1, see FIG. 2) between these electrode layers. The material of the insulating layer 42 includes, for example, silicon oxide (SiO$_2$).

The electrode layer 401D and the electrode layer 401S are provided in the same level layer, and indicate the electrode layer of the first layer from the bottom. The electrode layer 402D and the electrode layer 402S are provided in the same level layer, and indicate the electrode layer of the second layer from the bottom. The electrode layer 403D and the electrode layer 403S are provided in the same level layer, and indicate the electrode layer of the third layer from the bottom. The electrode layer 404D and the electrode layer 404S are provided in the same level layer, and indicate the electrode layer of the fourth layer from the bottom.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An insulating layer not shown is provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D and 404D are provided between the semiconductor layer 22 and a drain-side selection gate electrode 45D. The electrode layers 401S, 402S, 403S and 404S are provided between the semiconductor layer 22 and a source-side selection gate electrode 45S.

In descriptions below, the electrode layers 401D, 402D, 403D, 404D, 401S, 402S, 403S and 404S may also be designated simply as an electrode layer 40. The number of layers of the electrode layer 40 is arbitrary and not limited to four as exemplified in the embodiment. A stacked body 44 shall include the electrode layer 40 and the insulating layer 42. The lower face of the electrode layer 401D (or the electrode layer 401S) of the first layer is a lower end 44d of the stacked body 44. The electrode layer 40 is, for example, a conductive silicon layer to which an impurity element such as boron (B) is added.

The drain-side selection gate electrode 45D is provided via an insulating layer not shown on the electrode layer 404D. The drain-side selection gate electrode 45D is, for example, a conductive silicon layer to which an impurity element such as boron (B) is added.

The source-side selection gate electrode 45S is provided via an insulating layer not shown over the electrode layer 404S. The source-side selection gate electrode 45S is, for example a conductive silicon layer to which an impurity element such as boron (B) is added.

The drain-side selection gate electrode 45D and the source-side selection gate electrode 45S are divided in the Y direction. The drain-side selection gate electrode 45D and the source-side selection gate electrode 45S may also be indicated simply as a selection gate electrode 45 without distinction.

A source line 47 is provided via an insulating layer not shown on the source-side selection gate electrode 45S. The source line 47 is connected to one end of a pair of channel body layers 20 (semiconductor layers) via a via 49S. The source line 47 is a metal interconnect or a conductive silicon layer to which an impurity is added.

A plurality of bit lines 48 are provided via an insulating layer not shown on the drain-side selection gate electrode 45D and the source line 47. The bit line 48 is, for example, a metal interconnect or a conductive silicon layer to which an impurity is added. The bit line 48 is connected to the other end of the pair of channel body layers 20 via a via 49D. The bit line 48 extends in the Y direction. The via 49S and the via 49D may simply be indicated as a via 49 without distinction. The material of the via 49 is, for example, tungsten (W).

A plurality of U-shaped memory holes 75 are provided in the semiconductor layer 22 and the stacked body 44. For example, in the electrode layers 401D to 404D and the drain-side selection gate electrode 45D, a hole that passes through these and extends in the Z direction is formed. In the electrode layers 401S to 404S and the source-side selection gate electrode 45S, a hole that passes through these and extends in the Z direction is formed. A pair of holes extending in the Z direction are connected via the semiconductor layer 22, and configure the U-shaped memory hole 75. In the embodiment, in addition to the U-shaped memory hole, a straight type memory hole is also included (to be described later).

The U-shaped channel body layer 20 (a semiconductor layer) is provided inside the memory hole 75. The channel body layer 20 is, for example, a silicon-containing layer. The silicon is, for example, polysilicon. A memory film 30 (a first insulating film) is provided (to be described later) between the channel body layer 20 and the inner wall of the memory hole 75.

A gate insulating film 50 (a second insulating film) is provided between the channel body layer 20 and the drain-side selection gate electrode 45D. The gate insulating film 50 is provided between the channel body layer 20 and the source-side selection gate electrode 45S.

The structure is not limited to one in which the whole inside of the memory hole 75 is embedded with the channel body layer 20, but such a structure is also acceptable that the channel body layer 20 is formed so that a hollow portion remains on the central axis side of the memory hole 75 and the hollow portion on the inner side thereof is embedded with an insulator.

The drain-side selection gate electrode 45D, the channel body layer 20 and the gate insulating film 50 therebetween configure a drain-side selection transistor STD. The channel body layer 20 above the drain-side selection transistor STD is connected electrically to the bit line 48.

The source-side selection gate electrode 45S, the channel body layer 20 and the gate insulating film 50 therebetween configure a source-side selection transistor STS. The channel body layer 20 above the source side selection transistor STS is connected electrically to the source line 47.

The drain-side selection transistor STD and the source-side selection transistor STS are cylindrical transistors.

The semiconductor layer 22, the channel body layer 20 and the memory film 30 provided in the semiconductor layer 22 configure a back gate layer transistor BGT.

Between the drain-side selection transistor STD and the back gate layer transistor BGT, a plurality of memory cells MCs utilizing the electrode layers 404D to 401D as a control gate are provided. In a similar manner, between the back gate layer transistor BGT and the source-side selection transistor STS, too, a plurality of memory cells MCs utilizing the electrode layers 401S to 404S each as a control gate are provided.

The plurality of memory cells MCs, the drain-side selection transistor STD, the back gate layer transistor BGT and the source-side selection transistor STS are connected in series through the channel body layer to configure one U-shaped memory string (NAND string) MS.

One memory string MS has a pair of columnar portions CL extending in the stacking direction of the stacked body 44 including a plurality of electrode layers 40, and a connecting portion 21 that is embedded in the semiconductor layer 22 and connects the pair of columnar portions CL. The connecting portion 21 has the channel body layer 20. The plurality of memory strings MSs are arranged in the X direction and the Y direction, and thereby a plurality of memory cells are provided three-dimensionally in the X-direction, the Y-direction and the Z-direction.

The plurality of memory strings MSs are provided in a memory cell array region in the foundation layer 11. For example, on the periphery of the memory cell array region in the foundation layer 11, a periphery circuit controlling the memory cell array is provided.

The nonvolatile semiconductor memory device 1 includes the channel body layer 20 provided passing through the stacked electrode layers 40. In the nonvolatile semiconductor memory device 1, the intersecting point of the electrode layer 40 and the channel body layer 20 is employed as a memory element. In the nonvolatile semiconductor memory device 1, lower ends of a pair of channel body layers 20 each are connected via the connecting portion 21. When current flows in the U-shaped semiconductor layer by the control of the selection gate electrode 45 formed in the upper part of each of the pair of channel body layers 20, read-in and erasure of data are performed.

Figure 2:
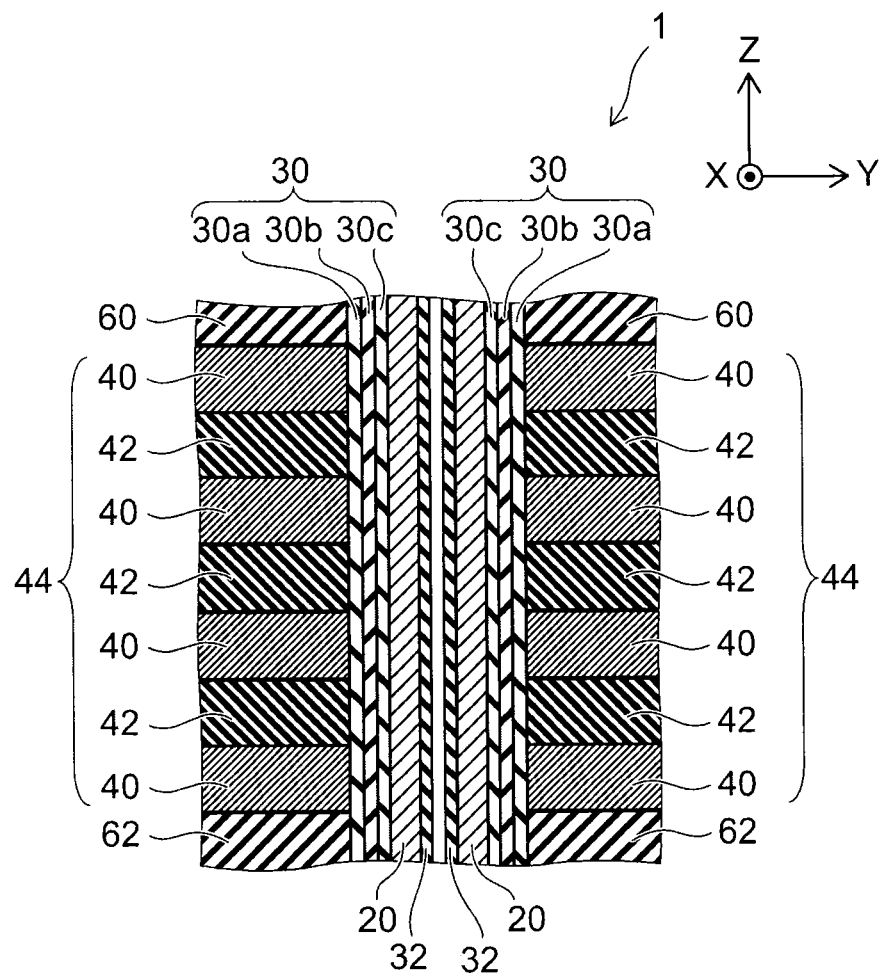
FIG. 2 is a schematic cross-sectional view showing a memory cell part of the nonvolatile semiconductor memory device according to the embodiment.

FIG. 2 is a schematic cross-sectional view showing a memory cell part of the nonvolatile semiconductor memory device according to the embodiment. The channel body layer 20 shown in FIG. 2 is one of the above-mentioned pair of channel body layers 20.

The nonvolatile semiconductor memory device 1 includes the foundation layer 11, the stacked body 44, the channel body layer 20 and the memory film 30. The stacked body 44 is provided on the above-mentioned foundation layer 11 (not shown in FIG. 2, see FIG. 1) via an insulating film 62. In the stacked body 44, each of the plurality of electrode layers 40 and each of the plurality of insulating layers 42 are stacked alternately. The insulating film 62 includes silicon oxide ($SiO_2$). An interlayer insulating film 60 (a first interlayer insulating film) is provided on the stacked body 44. The interlayer insulating film 60 includes silicon oxide ($SiO_2$).

The memory film 30 is provided between the channel body layer 20 and each of the plurality of electrode layers 40. The memory film 30 is also provided between the channel body layer 20 and each of the plurality of insulating layers 42. The memory film 30 has a multilayered structure.

In the memory film 30, from the electrode layer 40 side to the channel body layer 20 side, an oxide film 30a, a nitride film 30b and an oxide film 30c are arranged in this order. The nitride film 30b is a film including, for example, silicon nitride ($Si_3N_4$). The oxide films 30a and 30c are a film including silicon oxide ($SiO_2$). The memory film 30 has an ONO (Oxide-Nitride-Oxide) structure in which a nitride film is sandwiched by a pair of oxide films.

The channel body layer 20 functions as a channel in a transistor configuring a memory cell. The electrode layer 40 functions as a control gate. The memory film 30 functions as a memory film of the nonvolatile semiconductor memory device 1. The nitride film 30b functions as a data storage layer that accumulates charges injected from the channel body layer 20.

Figure 3:
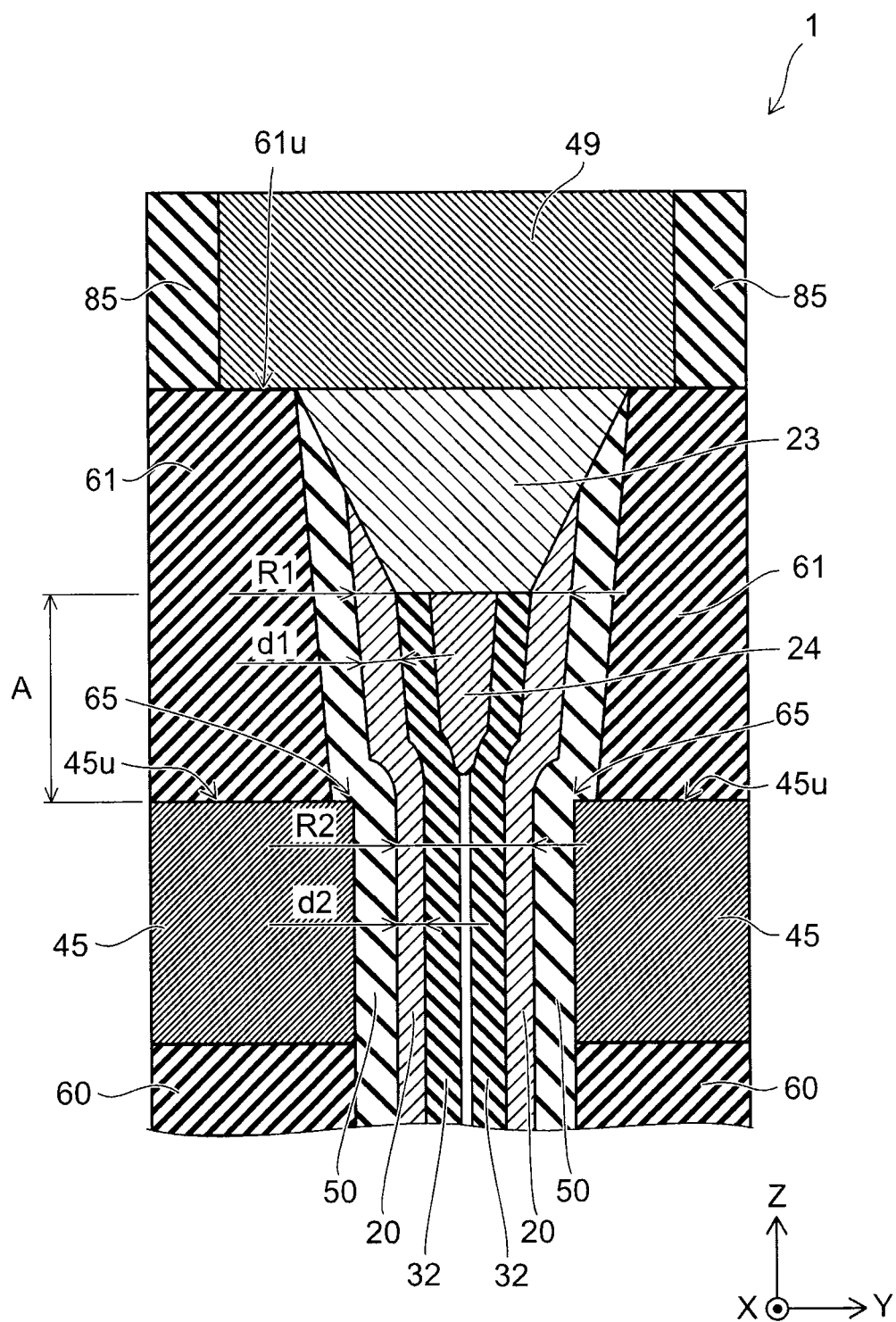
FIG. 3 is a schematic cross-sectional view showing a vicinity of the selection gate of the nonvolatile semiconductor memory device according to the embodiment.

FIG. 3 is a schematic cross-sectional view showing a vicinity of the selection gate of the nonvolatile semiconductor memory device according to the embodiment. The channel body layer 20 shown in FIG. 3 is one of the above-mentioned pair of channel body layers 20.

The nonvolatile semiconductor memory device 1 further includes an interlayer insulating film 60, a selection gate electrode 45, an interlayer insulating film 61 and a gate insulating film 50, in addition to the configuration shown in FIG. 2.

The selection gate electrode 45 is provided on the interlayer insulating film 60. The interlayer insulating film 61 (a second interlayer insulating film) is provided on the selection gate electrode 45. The interlayer insulating film 61 includes silicon oxide ($SiO_2$). There is a step 65 in a position in which the selection gate electrode 45 is in contact with the interlayer insulating film 61. That is, the step 65 is formed by the selection gate electrode 45 and the interlayer insulating film 61.

The channel body layer 20 extends from an upper end 61u of the interlayer insulating film 61 up to the lower end of the stacked body 44. The channel body layer 20 is in a round columnar shape (see FIG. 1). A conductive layer 23 includes conductive silicon to which an impurity such as phosphorous (P) is added. The conductive layer 23 is in contact with the channel body layer 20. A via 49 is provided on the conductive layer 23. The side wall of the via 49 is surrounded by an insulating layer 85. Inside the channel body layer 20, an insulating layer 32 as a core material is provided. A semiconductor layer 24 is provided below the conductive layer 23. The semiconductor layer 24 includes silicon.

The gate insulating film 50 is provided between the selection gate electrode 45 and the channel body layer 20. The structure of the gate insulating film 50 is the same as the above-mentioned ONO structure. The gate insulating film 50 is provided also inside the interlayer insulating film 61.

The gate insulating film 50 and the memory film 30 are connected in a position of the boundary of the interlayer insulating film 60 and the selection gate electrode 45. Including the gate insulating film 50 and the memory film 30, a simple naming of an insulating layer (a second insulating layer) may be given.

In the nonvolatile semiconductor memory device 1, a thickness d1 of at least a part of the channel body layer 20 provided above an upper end 45u of the selection gate electrode 45 is thicker than a thickness d2 of at least a part of the channel body layer 20 provided below the upper end 45u of the selection gate electrode 45.

Specifically, in the channel body layer 20 provided above the upper end 45u of the selection gate electrode 45, the thickness d1 of the channel body layer 20 in a region (a region A in the drawing) excluding the part in contact with the conductive layer 23 is thicker than the thickness d2 of at least the part of the channel body layer 20 provided below the upper end 45u of the selection gate electrode 45, in over the whole of the region. The difference between the thickness d1 and the thickness d2 is not less than 1 nm (nanometer).

An outer diameter R1 of the channel body layer 20 at the cross-section surface of the interlayer insulating film 61 cut vertically to the stacking direction of the stacked body 44 (the Z direction) is larger than an outer diameter R2 of the channel body layer 20 at the cross-section surface of the selection gate electrode 45 cut vertically to the stacking direction thereof.

The channel body layer 20 provided above the upper end 45u of the selection gate electrode 45 includes an impurity element. For example, the impurity element is included in the whole region of the channel body layer 20 provided above the upper end 45u of the selection gate electrode 45. In other words, the channel body layer 20 between the upper end 45u of the selection gate electrode 45 and the conductive layer 23 includes the impurity element. The impurity element is, for example, phosphorous (P).

In the nonvolatile semiconductor memory device 1, in order to enhance a generation efficiency of GIDL (Gate Induced Drain Leakage) to be described later, the impurity concentration in the channel body layer 20 near the step 65 may be made higher than the impurity concentration in the channel body layer 20 below the step 65.

FIGS. 4A to 9C are schematic cross-sectional views showing a manufacturing process of the nonvolatile semiconductor memory device according to the embodiment.

A method for forming each of films or each of layers that are described below is selected appropriately, unless otherwise specified, from any of a CVD (Chemical Vapor Deposition) method such as thermal CVD or plasma CVD, a sputtering method, an ALD (Atomic Layer Deposition) method, an epitaxial growth method and a coating method such as a spin coating method. The thermal CVD means an LP (low pressure)-CVD that performs a long mean free path of active species and a good step coverage property.

Figure 4A:
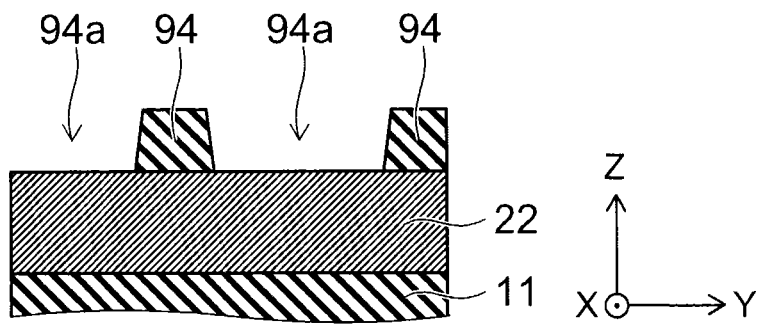

First, as shown in FIG. 4A, the semiconductor layer 22 is formed on the foundation layer 11. Subsequently, a resist pattern 94 is formed on the semiconductor layer 22. The resist pattern 94 has an opening 94a that opens a part of the surface of the semiconductor layer 22.

Figure 4B:
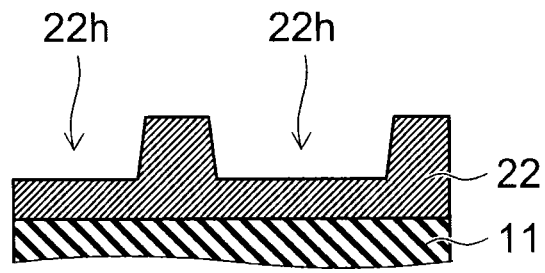

Next, as shown in FIG. 4B, the semiconductor layer 22 exposed from the resist pattern 94 is dry-etched with the resist pattern 94 being used as a mask. Consequently, a concave portion 22h is formed in the semiconductor layer 22.

Figure 4C:
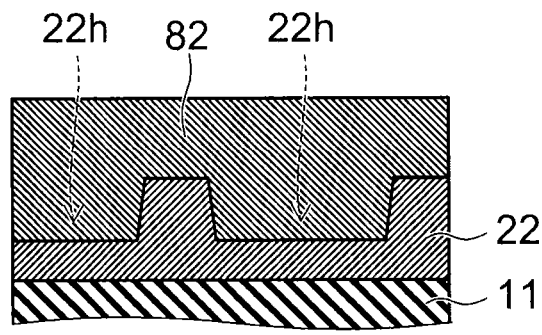
Figure 4D:
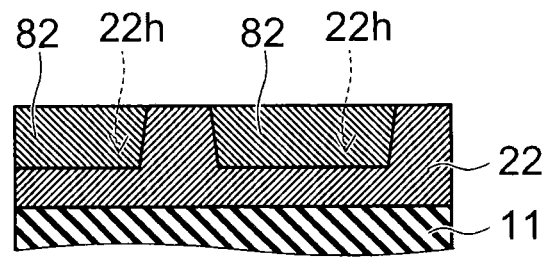

Next, as shown in FIG. 4C, a sacrifice layer 82 is formed on the semiconductor layer 22. Consequently, the sacrifice layer 82 is formed in the concave portion 22h. The material of the sacrifice layer 82 is, for example, a silicon nitride film, non-doped silicon, or the like. After that, the surface of the sacrifice layer 82 is etched back, and thereby the surface of the semiconductor layer 22 is exposed. This state is shown in FIG. 4D.

Figure 5A:
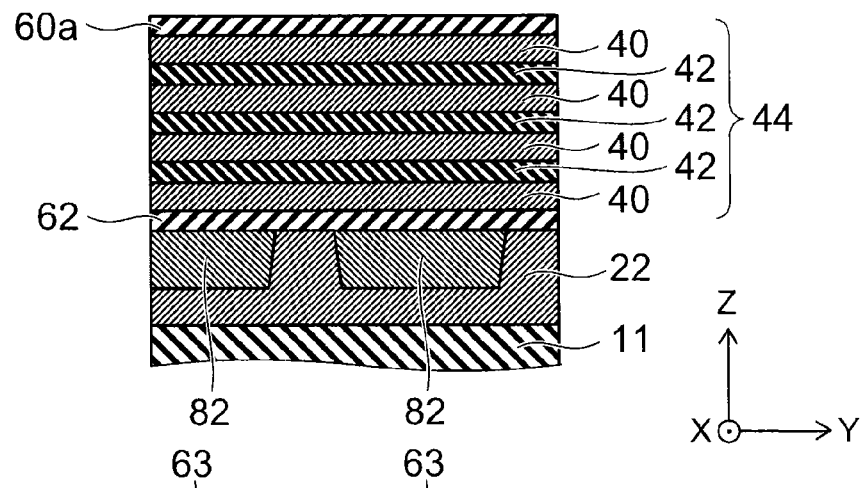

Next, as shown in FIG. 5A, the insulating film 62 is formed on the semiconductor layer 22 and on the sacrifice layer 82. Subsequently, the stacked body 44 is formed on the foundation layer 11, the semiconductor layer 22 and the sacrifice layer 82, via the insulating film 62. In the stacked body 44, each of a plurality of electrode layers 40 and each of a plurality of insulating layers 42 are stacked alternately. Subsequently, an insulating film 60a is formed on the uppermost electrode layer 40.

Next, by photolithography and RIE (Reactive Ion Etching), the insulating film 60a and the stacked body 44 are divided in the Y direction to form a trench that reaches the insulating film 62. After that, in the trench, an insulating layer 63 is embedded. This state is shown in FIG. 5B.

Figure 5B:
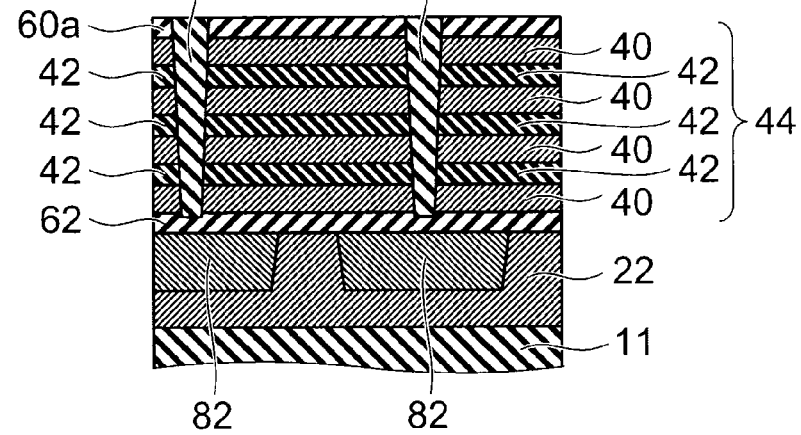

In FIG. 5B, the state, in which, for example, the insulating layer 63 is etched back and the upper end of the insulating layer 63 and the surface of the insulating film 60a are flush with each other, is shown. The insulating layer 63 extends in the X direction. The insulating layer 63 includes silicon oxide ($SiO_2$).

Figure 5C:
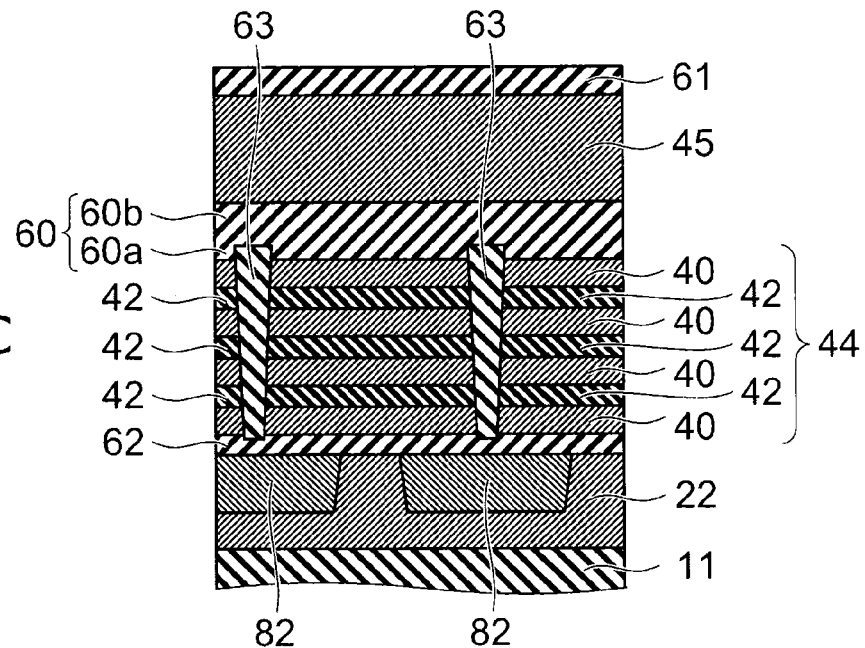
Figure 6A:
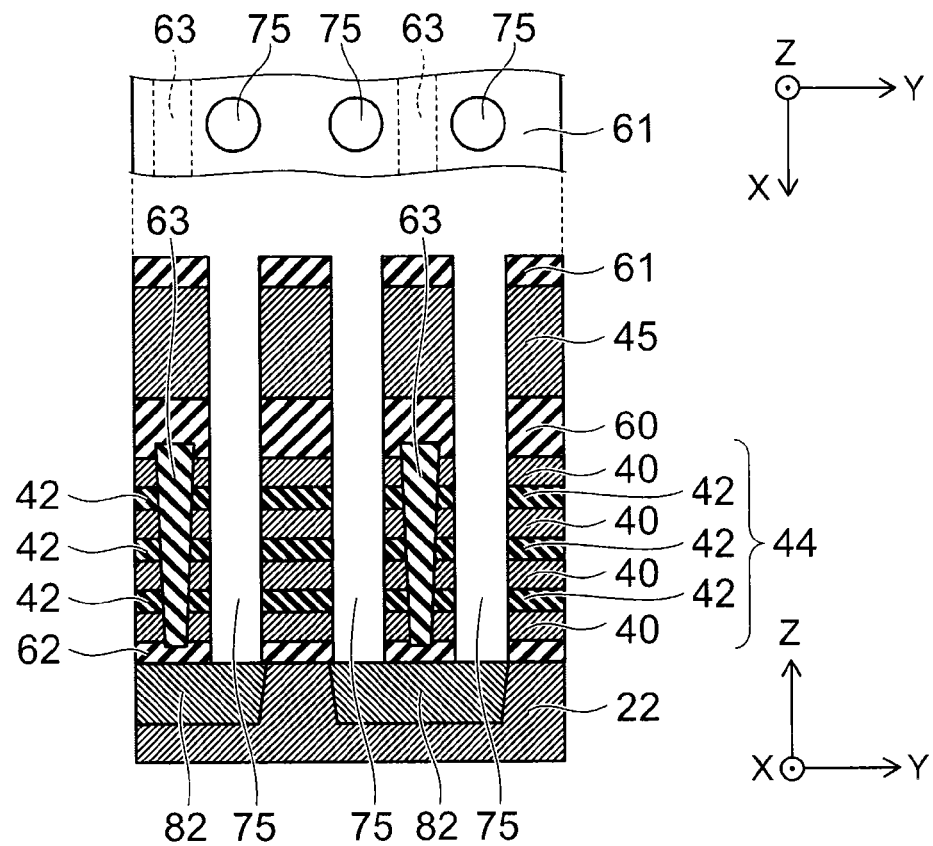

Next, as shown in FIG. 5C, an insulating film 60b is formed on the stacked body 44, via the insulating film 60a. Consequently, the interlayer insulating film 60 including the insulating films 60a and 60b is formed on the stacked body 44. Furthermore, the selection gate electrode 45 is formed on the interlayer insulating film 60. Subsequently, the interlayer insulating film 61 is formed on the selection gate electrode 45. In FIG. 6A and subsequent drawings, the showing of the foundation layer 11 is omitted.

In FIG. 6A, in addition to a schematic cross-sectional view, a schematic top view is shown.

As shown in FIG. 6A, the memory hole 75 passing through the interlayer insulating film 61, the selection gate electrode 45, the interlayer insulating film 60 and the stacked body 44 is formed by photolithography and RIE. The memory hole 75 extends in the stacking direction of the stacked body 44 (the Z direction). A pair of memory holes 75 are formed on the sacrifice layer 82 so as to sandwich the insulating layer 63 positioned approximately at the center of the sacrifice layer 82.

The outer shape at a cross-section surface of the memory hole 75 cut in the X direction (or the Y direction) is, for example, circular. In the stage in FIG. 6A, the memory hole 75 is formed so that each end part of a pair of memory holes 75 reaches the sacrifice layer 82. At the bottom of the memory hole 75, the sacrifice layer 82 is exposed.

Figure 6B:
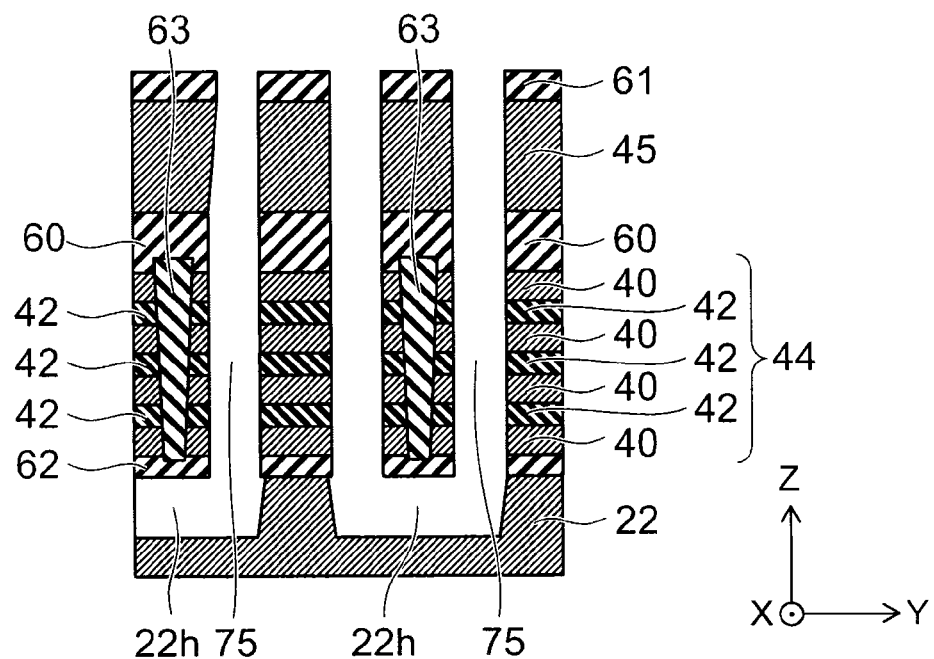

Next, as shown in FIG. 6B, the sacrifice layer 82 is removed through the memory hole 75 by, for example, wet etching. As an etching liquid, for example, an alkaline chemical liquid such as a KOH (potassium hydroxide) solution or a phosphoric acid solution ($H_3PO_4$), the etching rate of which is adjusted according to temperature conditions, is used.

Consequently, the sacrifice layer 82 is removed, and the concave portion 22h is formed again in the semiconductor layer 22. That is, each lower end of the pair of memory holes 75 is connected with one concave portion 22h to form one U-shaped memory hole 75.

Subsequent manufacturing processes will be described in detail using a cross-sectional view near the selection gate electrode 45.

Figures 7A, 7B, 7C:
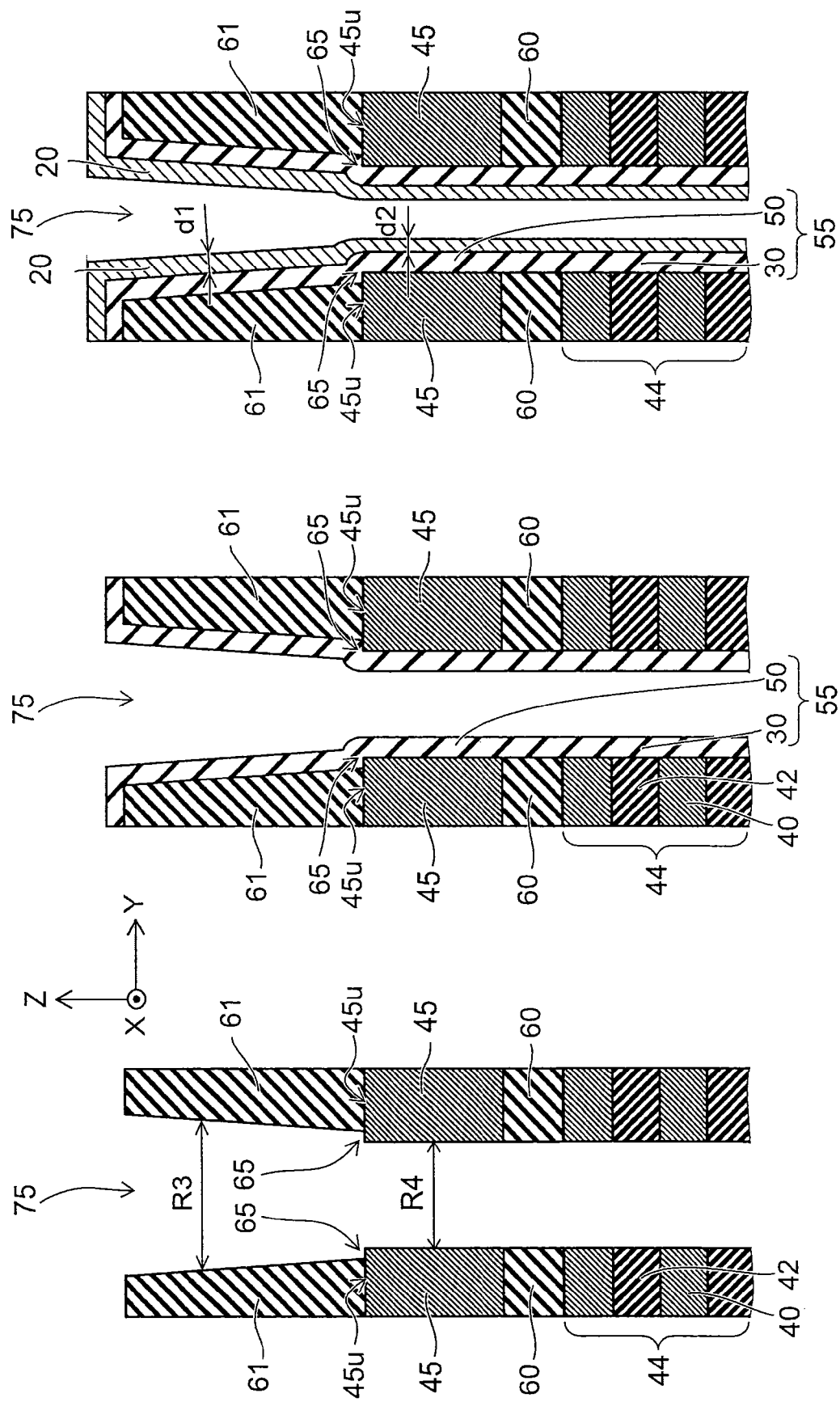

First, an etching process is applied to the inside of the memory hole 75 using hydrofluoric acid. This state is shown in FIG. 7A. The etching process makes the inside diameter of the memory hole 75 formed in the interlayer insulating film 61 larger than the inside diameter of the memory hole 75 formed in the selection gate electrode 45.

That is, by the etching process, an inside diameter R3 of the memory hole 75 above the upper end 45u of the selection gate electrode 45 is processed so as to become larger than an inside diameter R4 of the memory hole 75 below the upper end 45u of the selection gate electrode 45.

The inside diameter R4 is, for example, not less than 40 nm and not more than 100 nm. The height of the memory hole 75 from the semiconductor layer 22 is, for example, not less than 0.5 μm and not more than 5 m.

In this stage, the step 65 is formed between the selection gate electrode 45 and the interlayer insulating film 61. Further, a natural oxide film of the surface of the selection gate electrode 45 is removed.

Next, as shown in FIG. 7B, on the side wall of the memory hole 75, an insulating layer 55 including the gate insulating film 50 and the memory film 30 is formed by CVD.

Next, as shown in FIG. 7C, the channel body layer 20 is formed on the side wall of the insulating layer 55. In the process, the channel body layer 20 is formed on the side wall of the insulating layer 55 so that the thickness d1 of the channel body layer 20 to be formed above the upper end 45u of the selection gate electrode 45 becomes thicker than the thickness d2 of the channel body layer 20 to be formed below the upper end 45u of the selection gate electrode 45. For example, the channel body layer 20 is formed by any of the following methods.

(First Method)

The channel body layers 20 having different thicknesses are formed, for example, by a thermal CVD method or an ALD method. As a raw material gas, for example, a silane-based gas such as monosilane ($SiH_4$) is used. The silane-based gas is thermally decomposed and a silicon film is formed on the side wall of the insulating layer 55. Deposition temperature is not lower than 500° C.

In the process for forming the channel body layer 20, conditions are set so that the deposition rate of the channel body layer 20 to be formed above the upper end 45u of the selection gate electrode 45 is selectively larger than the deposition rate of the channel body layer 20 to be formed below the upper end 45u of the selection gate electrode 45.

As to the reaction rate in deposition, the rate becomes larger as the deposition temperature increases. As the deposition temperature increases, in the reaction, supply of the reaction gas tends to determine the rate. Further, the memory hole 75 according to the embodiment has a high aspect ratio. Accordingly, the higher the deposition temperature is set, the easier the reaction gas is consumed near the opening in the upper part of the memory hole in deposition. That is, such a state is brought that the reaction gas hardly reaches the lower part of the memory hole 75 in deposition.

Further, as the reaction proceeds and the channel body layer 20 in a prescribed thickness deposits on the side wall of the memory hole 75, the more the inside diameter R4 of the memory hole 75 is shortened (for example, about several nanometers). Consequently, the supply determining rate near the opening is accelerated furthermore.

Specifically, when denoting the deposition temperature by $T_0$ in the case where the deposition rate of the channel body layer 20 to be formed above the upper end 45$u$ of the selection gate electrode 45 is same as the deposition temperature of the channel body layer 20 to be formed below the upper end 45$u$ of the selection gate electrode 45, in a first method, the deposition of the channel body layer 20 is performed at a deposition temperature $T_1$ higher than $T_0$ by 20° C. to 30° C. That is, in the first method, the deposition of the channel body layer 20 is performed in one lot at the comparatively high temperature $T_1$. For example, when $T_0$ is a temperature in the range not less than 500° C. and not more than 520° C., $T_1$ to be deposition temperature is temperature in the range not less than 520° C. and not more than 550° C.

Further, in the memory hole 75 before the channel body layer 20 is deposited, there is the above-mentioned step 65. Consequently, the reaction gas is likely to reach above the step 65 and the reaction gas is hard to reach below the step 65. That is, by providing the step 65, the supply rate controlling near the opening is accelerated furthermore.

By the method described above, the thickness of the channel body layer 20 formed above the upper end 45$u$ of the selection gate electrode 45 is made selectively thicker than the thickness of the channel body layer 20 formed below the upper end 45$u$ of the selection gate electrode 45.

(Second Method)

Not all the deposition of the channel body layer 20 are to be performed collectively at the same temperature. The deposition temperature may be changed appropriately in the middle of the deposition. The number of changes is also not limited to one, but the deposition may be performed, divided into a plurality of stages.

For example, as one example, the case where the deposition temperature is changed once in the middle of the deposition will be described. In this case, from the start of deposition up to a prescribed time $t_0$, the channel body layer 20 is formed at a deposition temperature $T_2$ on the side wall of the insulating layer 55 and, then, up to a prescribed time $t_1$, the channel body layer 20 is formed at a deposition temperature $T_3$ higher than the deposition temperature $T_2$ on the side wall of the insulating layer 55. The difference between the deposition temperature $T_3$ and the deposition temperature $T_2$ is not less than 20° C. and not more than 30° C.

As one example, the deposition temperature $T_2$ may be set to a temperature at which the deposition rate of the channel body layer 20 to be formed above the upper end 45$u$ of the selection gate electrode 45 and the deposition rate of the channel body layer 20 to be formed below the upper end 45$u$ of the selection gate electrode 45 are equal to each other (corresponding to the above-mentioned deposition temperature $T_0$). Further, the deposition temperature $T_3$ may be set to a temperature higher than the $T_2$ by 20° C. to 30° C. In this case, from the start of the deposition to the time $t_0$, the thickness of the channel body layer 20 formed on the side wall of the insulating layer 55 is uniform everywhere. Then, in the period of time $t_0$, the channel body layer 20 having a thickness necessary for characteristics of the memory cell is formed previously on the side wall of the memory film 30.

Subsequently, the deposition temperature is raised from the temperature $T_2$ to the temperature $T_3$. Consequently, the deposition rate of the channel body layer 20 to be formed above the upper end 45$u$ of the selection gate electrode 45 becomes selectively higher than the deposition rate of the channel body layer 20 to be formed below the upper end 45$u$ of the selection gate electrode 45. As the result, after the time $t_1$, the thickness of the channel body layer 20 formed above the upper end 45$u$ of the selection gate electrode 45 becomes selectively thicker than the thickness of the channel body layer 20 formed below the upper end 45$u$ of the selection gate electrode 45.

(Third Method)

CVD is not limited to thermal CVD. For example, after forming the channel body layer 20 on the side wall of the insulating layer 55 by a thermal CVD method or an ALD method, the channel body layer 20 may be formed on the side wall of the insulating layer 55 by a plasma CVD method.

The step coverage property of plasma CVD is, generally, lower than the step coverage property of thermal CVD and ALD. At the beginning, by thermal CVD or ALD, the channel body layer 20 in uniform thickness is formed on the side wall of the insulating layer 55. Next, by plasma CVD, the channel body layer 20 is formed on the side wall of the insulating layer 55 so that the thickness of the channel body layer 20 formed above the upper end 45$u$ of the selection gate electrode 45 becomes thicker than the thickness of the channel body layer 20 formed below the upper end 45$u$ of the selection gate electrode 45. By such a method, the channel body layer 20 may be formed on the side wall of the insulating layer 55.

Next, as shown in FIG. 8A, a resist layer 90 is formed in the memory hole 75. The upper end of the resist layer 90 is to be positioned below the step 65. Subsequently, arsenic (As) is ion-implanted into the channel body layer 20 near the step 65. For example, arsenic is implanted into the channel body layer 20 of a part shown by numeral 20$a$. After that, the resist layer 90 is removed.

Next, as shown in FIG. 8B, a resist layer 91 is formed in the memory hole 75. The upper end of the resist layer 91 is to be positioned below the upper end 61$u$ of the interlayer insulating film 61. Next, RIE process is applied to the channel body layer 20 and the insulating layer 55 exposed from the resist layer 91. Consequently, for an upper part cross-section of the channel body layer 20 and for an upper part cross-section of the insulating layer 55, a taper shape is formed. After that, the resist layer 91 is removed.

Next, as shown in FIG. 8C, on the side wall of the channel body layer 20 and the interlayer insulating film 61, the insulating layer 32 is formed.

Subsequently, the semiconductor layer 24 is formed on the side wall of the insulating layer 32 above the upper end 45$u$ of the selection gate electrode 45. In the stage, the height of the upper end of the semiconductor layer 24 is adjusted appropriately by etch back. Consequently, the upper part of the insulating layer 32 is exposed.

Next, as shown in FIG. 9A, by removing the upper part of the insulating layer 32, the upper part of the channel body layer 20 is exposed from the insulating layer 32.

Next, as shown in FIG. 9B, on the semiconductor layer 24, a semiconductor layer (that is, the conductive layer 23) including an impurity element such as phosphorous (P) is formed. The conductive layer 23 is in contact with the upper part of the channel body layer 20.

Subsequently, the conductive layer 23 and the channel body layer 20 are heated. Consequently, the impurity element included in the conductive layer 23 diffuses into the channel body layer 20. Here, the impurity element is introduced into the channel body layer 20 above the upper end 45$u$ of the selection gate electrode 45.

Next, as shown in FIG. 9C, the via 49 is formed on the conductive layer 23. The side wall of the via 49 is covered with the insulating layer 85. Subsequently, the bit line, the source line etc. shown in FIG. 1 are formed. By the manufacturing process, the nonvolatile semiconductor memory device 1 is formed.

In the nonvolatile semiconductor memory device 1, the selection gate electrode 45 is provided on the stacked body 44. The selection gate electrode 45 brings a prescribed memory string into a selected state, or brings a prescribed memory string into a non-selected state. In the selected state, it is possible to perform a read-in operation of the selected memory string. In the non-selected state, the effect of the potential of the bit line 48 on the memory string in the non-selected state is cut off.

It is desirable that a prescribed current flows through the memory string in the selected state, and that a current does not flow as far as possible through the memory string in the non-selected state. That is, a smaller S factor (a subthreshold factor) is desirable.

The S factor depends on the thickness of the channel body layer 20. When the channel body layer 20 becomes thinner, the S factor becomes smaller, and the controllability by the selection gate electrode 45 improves. In the nonvolatile semiconductor memory device 1, since the thickness of the channel body layer 20 with which the selection gate electrode 45 is in contact via the gate insulating film 50 is thinner, the S factor is small.

In the erasure operation of the memory string, GIDL (Gate Induced Drain Leakage) generated in the vicinity of the upper end 45u of the selection gate electrode 45 is utilized. A hole current generated by the GIDL boosts the memory string to a positive potential.

Specifically, a potential higher than the potential of the selection gate electrode 45 is applied to the source line 47. Consequently, in the channel body layer 20 above the selection gate electrode 45, a depletion layer is formed. To the channel body layer 20 in which the depletion layer is formed, a strong electric field is applied to generate electrons and holes (the generation of an electron-hole pair). Then, holes are injected into the channel body layer 20 below the selection gate electrode 45. Consequently, in the stacked body 44, the potential of the channel body layer 20 becomes higher than the potential of the electrode layer 40.

On the other hand, the electrode layer 40 is set at a low voltage. Therefore, by the potential difference between the raised potential of the channel body layer 20 and the potential of the electrode layer 40, electrons accumulated in the nitride film 30b are pulled out. Consequently, data are erased. Alternatively, there is also such a case that holes boosting the channel body layer 20 to a positive potential are directly injected into the nitride film 30b and pairs of holes and electrons disappear to erase data.

The hole current depends on the thickness of the channel body layer 20. When the thickness of the channel body layer 20 becomes thicker and the depletion by the selection gate electrode 45 is suppressed, the GIDL increases. In the nonvolatile semiconductor memory device 1, since the channel body layer 20 above the step 65 has a thicker thickness and, furthermore, includes the impurity element, the width of the depletion layer formed in the channel body layer 20 above the step 65 becomes narrower. Consequently, electrons and holes are generated efficiently. This is because a stronger electric field is applied to the depletion layer.

Further, the S factor is desirably smaller also in the memory string. Because when the S factor becomes smaller, the ratio of an ON current and an OFF current becomes higher and detection sensitivity of a sense amplifier increases. In the nonvolatile semiconductor memory device 1, since the thickness of the channel body layer 20 contacting via the memory film 30 is thinner, the S factor in the memory string is smaller.

The channel body layer 20 between the upper end 45u of the selection gate electrode 45 and the via 49 is, however, parasitic resistance for the selection gate electrode 45.

In order for the ON current to flow efficiently through the channel body layer 20, it is necessary to lower the parasitic resistance of the channel body layer 20 between the upper end 45u of the selection gate electrode 45 and the via 49. In the nonvolatile semiconductor memory device 1, since the thickness of the channel body layer 20 between the upper end 45u of the selection gate electrode 45 and the via 49 is thicker and furthermore the impurity element is introduced, the resistance of the part is reduced.

If the thickness of the channel body layer 20 provided above the upper end 45u of the selection gate electrode 45 and the thickness of the channel body layer 20 provided below the upper end 45u of the selection gate electrode 45 are in a uniformly thin state, the hole current by the GIDL reduces and erasure characteristics in the memory string deteriorates. Further, the parasitic resistance of the channel body layer 20 between the upper end 45u of the selection gate electrode 45 and the via 49 becomes high.

If the thickness of the channel body layer 20 provided above the upper end 45u of the selection gate electrode 45 and the thickness of the channel body layer 20 provided below the upper end 45u of the selection gate electrode 45 are in a uniformly thick state, the S factor increases. In the embodiment, the tradeoff relationship is canceled.

In the process for manufacturing the nonvolatile semiconductor memory device 1, while providing a large space above the step 65 and providing a small space below the step 65, channel body layer 20 is formed. Consequently, the reaction gas reaches easily above the step 65 and the reaction gas hardly reaches below the step 65. As the result, the structure, in which the thickness of the channel body layer 20 provided above the upper end 45u of the selection gate electrode 45 is thicker than the thickness of the channel body layer 20 provided below the upper end 45u of the selection gate electrode 45, is surely formed.

In the embodiment, the nonvolatile semiconductor memory device may be formed by a so-called replacing method, by preparing the stacked body 44 using a sacrifice layer in place of the insulating layer 42 and, after forming the memory hole 75, eliminating simultaneously the sacrifice layer 82 and the sacrifice layer sandwiched by the electrode layer 40 and the electrode layer 40. In this case, in place of the insulating layer 42, the memory film 30 is provided between the electrode layer 40 and the electrode layer 40.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
    a foundation layer;
    a stacked body provided on the foundation layer, and each of a plurality of electrode layers and each of a plurality of insulating layers being stacked alternately in the stacked body;
    a first interlayer insulating film provided on the stacked body;
    a gate electrode provided on the first interlayer insulating film;
    a second interlayer insulating film provided on the gate electrode;
    a semiconductor layer extended from an interior portion of the second interlayer insulating film to a lower end of the stacked body;
    a first insulating film provided between the semiconductor layer and each of the plurality of electrode layers;
    a second insulating film provided between the semiconductor layer and the gate electrode; and
        a third insulating film provided inside the semiconductor layer, the third insulating film being disposed along the semiconductor layer in an interior portion of the second interlayer insulating film, an upper end of the third insulating film being positioned on an upper side of the gate electrode,
        a thickness of the semiconductor layer provided above an upper end of the gate electrode being thicker than a thickness of the semiconductor layer provided below the upper end of the gate electrode.

2. The device according to claim 1, wherein an outer diameter of the semiconductor layer at a cross-section surface of the second interlayer insulating film cut vertically to a stacking direction of the stacked body is larger than an outer diameter of the semiconductor layer at a cross-section surface of the gate electrode cut vertically to the stacking direction.

3. The device according to claim 1, wherein a difference between the thickness of the semiconductor layer provided above the upper end of the gate electrode and a thickness of the semiconductor layer contacting with the gate electrode via the second insulating film is not less than one nanometer.

4. The device according to claim 1, wherein the semiconductor layer provided above the upper end of the gate electrode includes an impurity element.

5. The device according to claim 1, further comprising a first member provided inside the third insulating film, the first member being positioned on the upper side of the gate electrode.

6. The device according to claim 5, wherein a material of the first member is different from a material of the third insulating film.

7. The device according to claim 5, wherein the first member includes silicon.

8. The device according to claim 1, wherein an upper end of the semiconductor layer is positioned on an upper side of an upper end of the third insulating film.

9. The device according to claim 1, further comprising a conductive layer provided on the third insulating film, the conductive layer is in touch with the semiconductor layer.

10. The device according to claim 9, wherein the conductive layer includes silicon in which impurities are added.

11. A nonvolatile semiconductor memory device, comprising:
    a foundation layer;
    a second semiconductor layer provided on the foundation layer;
    a stacked body provided on the second semiconductor layer, and each of a plurality of electrode layers and each of a plurality of insulating layers are stacked alternately in the stacked body;
    a first interlayer insulating film provided on the stacked body;
    a gate electrode provided on the first interlayer insulating film;
    a second interlayer insulating film provided on the gate electrode;
    a pair of first semiconductor layers extended from an interior portion of the second interlayer insulating film to the second semiconductor layer;
    a first insulating film provided between each of the pair of semiconductor layers and each of the plurality of electrode layers;
    a second insulating film provided between each of the pair of semiconductor layers and the gate electrode; and
    a third insulating film provided inside the pair of first semiconductor layers, the third insulating film being disposed along the pair of first semiconductor layers in an interior portion of the second interlayer insulating film, an upper end of the third insulating film being positioned on an upper side of the gate electrode,
    a thickness of each of the pair of semiconductor layers provided above an upper end of the gate electrode being larger than a thickness of each of the pair of first semiconductor layers provided below the upper end of the gate electrode.

12. The device according to claim 11, wherein an outer diameter of each of the pair of first semiconductor layers at a cross-section surface of the second interlayer insulating film cut vertically to a stacking direction of the stacked body is larger than an outer diameter of each of the pair of first semiconductor layers at a cross-section surface of the gate electrode cut vertically to the stacking direction.

13. The device according to claim 11, wherein a difference between a thickness of one of the pair of first semiconductor layers provided above the upper end of the gate electrode and a thickness of one of the pair of first semiconductor layers contacting with the gate electrode via the second insulating film is not less than one nanometer.

14. The device according to claim 11, wherein each of the pair of first semiconductor layers provided above the upper end of the gate electrode includes an impurity element.

* * * * *